United States Patent [19]

Umeda et al.

[11] 4,038,692

[45] July 26, 1977

[54] TAPE SENSING DEVICE FOR MAGNETIC TAPE RECORDING AND/OR REPRODUCING APPARATUS

[75] Inventors: Kenkichi Umeda, Tokyo; Hiroyuki Yamauchi, Urawa, both of Japan

[73] Assignee: Sony Corporation, Tokyo, Japan

[21] Appl. No.: 556,120

[22] Filed: Mar. 6, 1975

[30] Foreign Application Priority Data

Mar. 12, 1974 Japan .................................. 49-28813

[51] Int. Cl.² .............................................. G11B 5/45
[52] U.S. Cl. ........................................ 360/25; 360/65; 360/66
[58] Field of Search ...................... 360/25, 65, 66, 112

[56] References Cited
U.S. PATENT DOCUMENTS

| 3,200,207 | 8/1965 | Rainer et al. | 360/112 |
| 3,588,380 | 6/1971 | Horlander | 360/25 |
| 3,601,558 | 8/1971 | Sugaya | 360/25 |
| 3,812,529 | 5/1974 | Yoichi | 360/25 |
| 3,918,088 | 11/1975 | Tabuchi | 360/66 |

Primary Examiner—James W. Moffitt
Attorney, Agent, or Firm—Lewis H. Eslinger; Alvin Sinderbrand

[57] ABSTRACT

A device for sensing the type of magnetic coating on a magnetic tape while the latter is at rest, for example, in a magnetic tape recording and/or reproducing apparatus, has a DC magnetic recording head energizable by a predetermined DC voltage for applying a DC magnetic flux to the tape with which such head is engaged, a magnetic sensing element preferably coupled with the DC magnetic recording head for sensing the remanence or residual magnetism in the tape while the latter remains at rest following the application of the DC magnetic flux to the tape, and a level detector for detecting the level of the sensed remanence of the tape as an indication of the type of magnetic coating thereon. Such level detector may be advantageously employed for controlling a frequency equalizing circuit and/or a bias oscillator included in the signal recording circuit of the recording and/or reproducing apparatus so as to automatically adapt the latter for recording operations on the particular type of tape installed therein.

16 Claims, 3 Drawing Figures

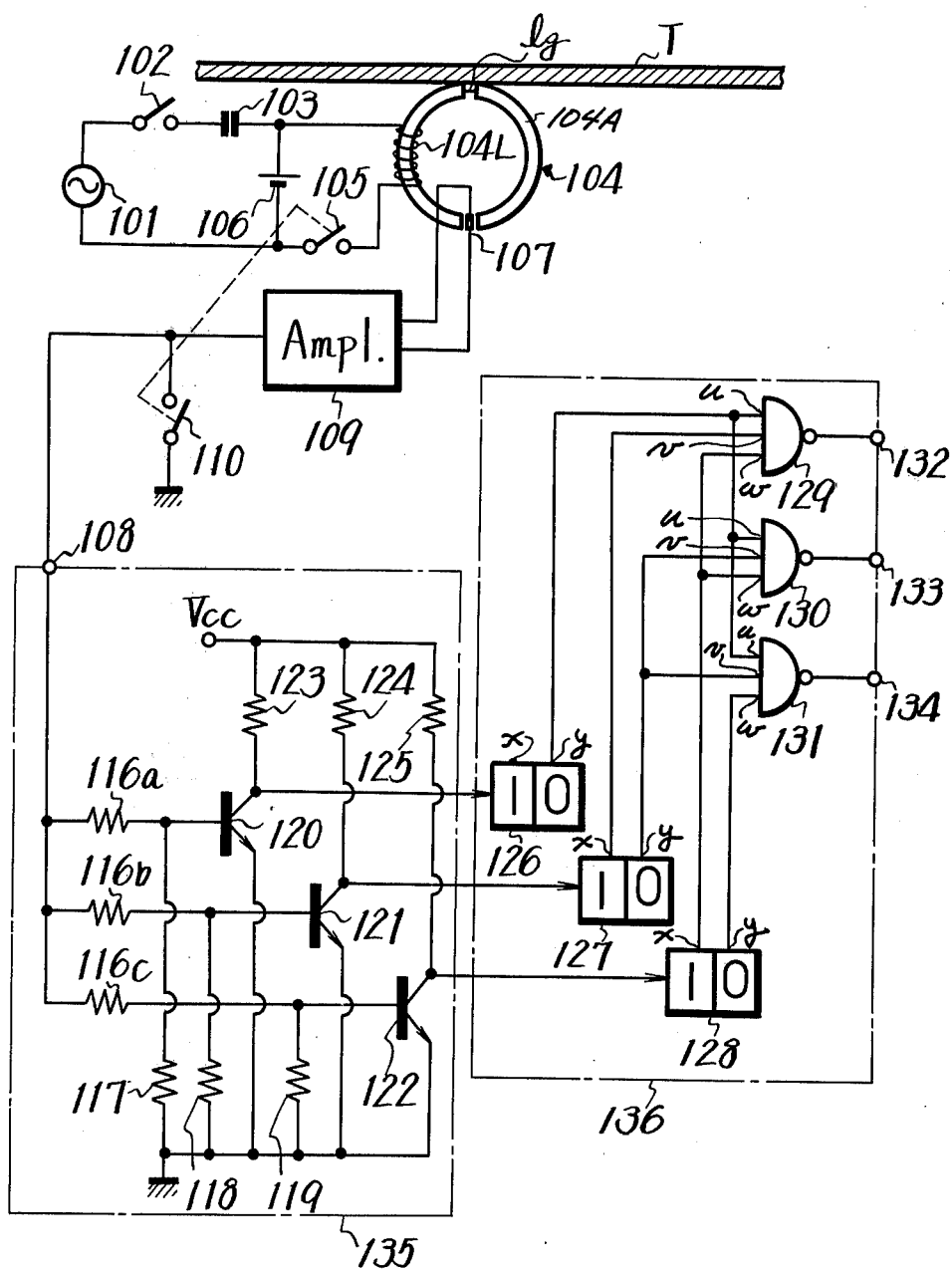

TAPE SENSING DEVICE FOR MAGNETIC TAPE RECORDING AND/OR REPRODUCING APPARATUS

BACKGROUND OF THE INVENTION

1. Field of the Invention

This invention relates generally to a device for sensing the type of magnetic coating on a magnetic tape for use with a tape recording and/or reproducing apparatus.

2. Description of the Prior Art

Magnetic tapes coated with various kinds of magnetic materials are now commercially available for use with tape recording and/or reproducing apparatus. For example, magnetic tapes are available that are coated with $\gamma\text{-}Fe_2O_3$ (gamma-ferric oxide) or with $CrO_2$ (chromium dioxide). By reason of the different magnetic properties of such tapes, it is necessary that certain characteristics of recording and/or reproducing apparatus, for example, the bias signal applied to the magnetic recording head and/or the equalizing function of a frequency equalizing circuit, be changed to obtain the optimum recording conditions of the apparatus when used with the various types of magnetic tapes. Accordingly, the conventional magnetic tape recording and/or reproducing apparatus is usually provided with a tape selector switch which has to be manually actuated by the operator of the apparatus for obtaining the proper recording conditions for the magnetic tape to be employed. If the operator forgets to manipulate the tape selector switch to the position corresponding to the type of the tape being employed, or if the type of magnetic coating on the tape is not known to the operator, then recording on the magnetic tape may be effected under less than optimum conditions with consequent loss of the desired recording quality.

In order to avoid the above problem, it has been proposed to pre-record a reference signal, for example, with a frequency of 10 KHz, on an initial portion of each magnetic tape, and to provide the tape recording and/or reproducing apparatus with means by which, prior to a regular recording operation of the apparatus, the pre-recorded reference signal is reproduced and the level of the reproduced reference signal is detected as an indication of the type of magnetic coating on the tape, with the detected level of the reproduced reference signal being employed to automatically select the proper bias signal and equalizing function for the tape in question. However, the foregoing proposed arrangement is disadvantageous in that it requires the pre-recording of the tapes with the reference signal and the reproducing of such reference signal by a reproducing operation and/or reproducing apparatus prior to the commencement of a recording operation of the latter. In the case of tape cassettes, particularly, the reproducing of the pre-recorded reference signal for establishing the type of tape in the cassette is especially troublesome in that it may require the rewinding of the tape to locate the portion of the latter on which the reference signal is pre-recorded.

OBJECTS AND SUMMARY OF THE INVENTION

Accordingly, it is an object of this invention to provide an improved device for sensing the type of magnetic coating on a magnetic tape, particularly when installed in a tape recording and/or reproducing apparatus, and which avoids the above described problems and disadvantages of the prior art.

Another object is to provide a device, as aforesaid, which can sense the type of magnetic coating on a magnetic tape while the latter is at rest in a tape recording and/or reproducing apparatus.

A further object is to provide a tape sensing device, as aforesaid, which can automatically achieve proper selection of the biasing signal and the equalizing function of the tape recording and/or reproducing apparatus in which the tape is installed.

In accordance with an aspect of the invention, a device for sensing the type of magnetic coating on a magnetic tape while the latter is at rest, for example, in a tape recording and/or reproducing apparatus, has a DC magnetic recording head energizeable by a predetermined DC voltage for applying a DC magnetic flux to the tape with which such head is engaged, a magnetic sensing element preferably coupled with the DC magnetic recording head for sensing the remanence or residual magnetism in the tape while the latter remains at rest following the application of the DC magnetic flux to the tape, and a level detector for detecting the level of the sensed remanence of the tape as an indication of the type of magnetic coating thereon. Such level detector may be advantageously employed for controlling a frequency equalizing circuit and/or a bias oscillator included in the recording and/or reproducing apparatus so as to automatically obtain the proper equalizing function and bias signal for recording operations on the particular type of tape installed in the apparatus.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIG. 3 is a diagrammatic view illustrating another embodiment of a tape sensing device according to this invention.

DESCRIPTION OF THE PREFERRED EMBODIMENTS

Figure 1:
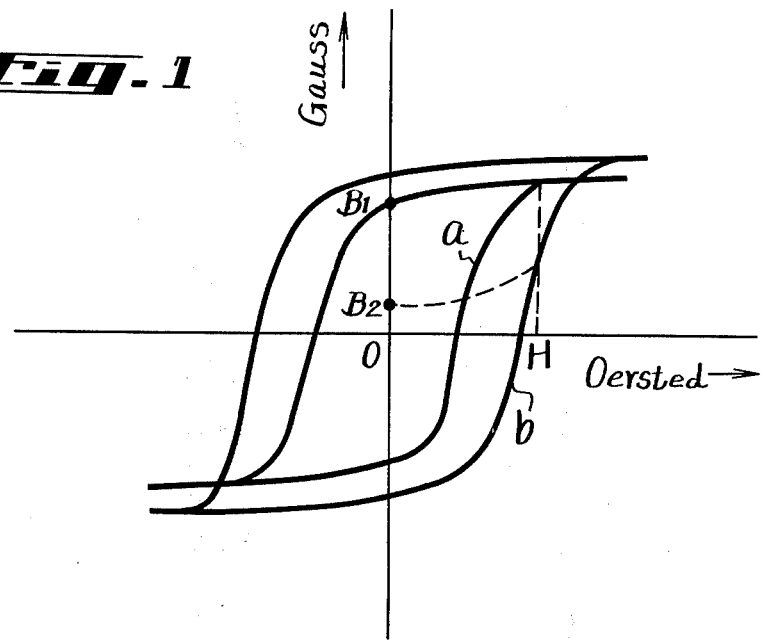
FIG. 1 is a graph illustrating the magnetic properties of two magnetic tapes having different types of magnetic coatings, and to which reference will be made in explaining the operation of tape sensing devices according to this invention.

Referring first to FIG. 1, it will be noted that the magnetic property of a magnetic tape is indicated or represented by its respective magnetic hysteresis curve. Thus, on FIG. 1, the curve $a$ represents the magnetic property of a magnetic tape employing gamma-ferric oxide in its magnetic coating, while the curve $b$ represents the magnetic property of a magnetic tape using chromium dioxide in its magnetic coating. When a DC magnetic flux of H oersteds is applied to each of the magnetic tapes, the remanence or residual magnetism remaining in the tape upon the discontinuation of such DC magnetic flux has the value $B_1$ in the case of the magnetic tape having gamma-ferric oxide in its magnetic coating, while the remanence or residual magnetism of the magnetic tape having chromium dioxide in ple, in the form of a Hall-effect element, is interposed in the core 104 and is suitably connected to an amplifier 109. The output of amplifier 109 is adapted to be connected to ground through a switch 110 which is preferably ganged with the switch 105 so as to be opened and closed simultaneously with the latter. The output terminal of amplifier 109 is further connected to an input terminal 108 of a level detecting circuit 135.

In the level detecting circuit 135, input terminal 108 is connected to ground through a parallel arrangement of series connected bias setting resistors 116a and 117, series connected bias setting resistors 116b and 118, and series connected bias setting resistors 116c and 119. The level detecting circuit 135 is further shown to include three NPN-type transistors 120, 121 and 122 having their emitter electrodes connected to ground, while their collector electrodes are connected through resistors 123, 124 and 125, respectively, to a power source $V_{cc}$. Further, the base electrode of transistor 120 is connected to the connection point between resistors 116a and 117, the base electrode of transistor 121 is connected to the connection point between the resistors 116b and 118, and the base electrode of transistor 122 is connected to the connection point between resistors 116c and 119. The series connected resistors 116a and 117, 116b and 118, and 116c and 119 are respectively dimensioned so that the corresponding transistors 120, 121 and 122, respectively, will be turned ON in response to different, progressively increasing levels of the signal applied to input terminal 108 from amplifier 109 when switch 110 is open, as hereinafter described in detail.

Figure 2:
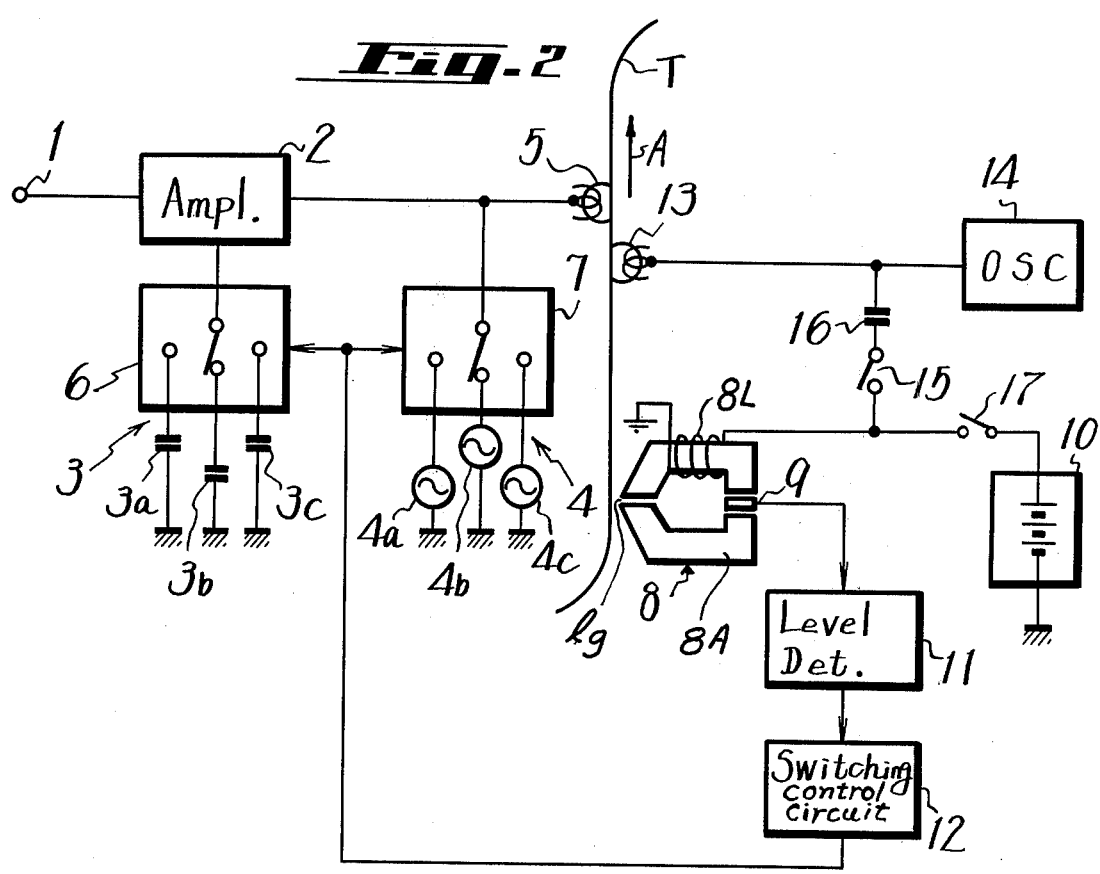
FIG. 2 is a schematic block diagram showing portions of a tape recording and/or reproducing apparatus having a tape sensing device according to one embodiment of this invention.

Further, as shown in FIG. 3, a switching control circuit 136 of the tape sensing device embodying this invention may include first, second and third flip-flop circuits 126, 127 and 128 having trigger terminals connected to the collector electrodes of transistors 120, 121 and 122, respectively. Each of the flip-flop circuits 126, 127 and 128 is shown to have two output terminals $x$ and $y$ at which signals 1 and 0 respectively appear in a first or normal state of the flip-flop circuit, with such signals being reversed, that is, the signals 1 and 0 appearing at the output terminals $y$ and $x$, respectively, when the flip-flop circuit 126, 127 or 128 is triggered to its second state by means of a signal being applied to its trigger terminal in response to the turning ON of the respective transistor 120, 121 or 122. The switching control circuit 136 is further shown to include first, second and third NAND-circuits 129, 130 and 131, respectively, having their outputs connected to output terminals 132, 133 and 134, respectively, of the switching control circuit. Further, each of the NAND-circuits 129, 130 and 131 is provided with three input terminals $u$, $v$ and $w$, with the second output terminal $y$ of flip-flop circuit 126 being connected to the first input terminal $u$ of each of the NAND-circuits 129, 130 and 131. The first output terminal $x$ of flip-flop circuit 127 is connected to the second input terminal $v$ of NAND-circuit 129, while the second output terminal $y$ of flip-flop circuit 127 is connected to the second input terminals $v$ of NAND-circuits 130 and 131. Finally, as shown, the first output terminal $x$ of flip-flop circuit 128 is connected to the third input terminals $w$ of NAND-circuits 129 and 130, while the second output terminal $y$ of flip-flop circuit 128 is connected to the third input terminal $w$ of NAND-circuit 131. Each of the NAND-circuits 129, 130 and 131 is arranged to provide a signal 0 at its output terminal when the signals applied to its input terminals $u,v$ and $w$ all have the value 1. Conversely, each of the NAND-circuits 129, 130 and 131 provides a signal having the value 1 at its output terminal when any one or more of the signals applied to its input terminals $u$, $v$ and $w$ has the value 0. Finally, the output terminals 132, 133 and 134 of switching control circuit 136 are suitably connected to switching circuits, for example, the switching circuits shown schematically at 6 and 7 of FIG. 2 so that the various combinations of output signals appearing at terminals 132, 133 and 134 will be effective to obtain the equalizing function and biasing signal necessary for recording operations on magnetic tapes having various magnetic coating materials thereon.

The tape sensing device described above with reference to FIG. 3 operates as follows:

Initially, switch 102 and ganged switches 105 and 110 are all closed so that with tape T at rest, a DC signal or voltage having a bias or AC signal added thereto is applied to the coil or winding 104L of head 104, while the output of amplifier 109 is grounded. Then, switch 102 is opened, while switches 105 and 110 remain closed, so that the AC or bias current applied through capacitor 103 to winding 104L is converged to zero amplitude, whereby any magnetic charge previously existing on head 104 is removed from the latter. After the bias current has been converged or reduced to zero by the opening of switch 102, the continued application of the DC voltage to winding 104L through closed switch 105 is effective to apply a DC magnetic flux across gap $l_g$ to the adjacent portion of tape T which remains at rest. Following the application of the DC magnetic flux to the tape, ganged switches 105 and 110 are opened, with the result that the magnetic sensitive or Hall-effect element 107 interposed in core 104A senses the remanence or residual magnetism in the stationary tape T and the resulting output of element 107 as amplified by amplifier 109, is applied to input terminal 108 of level detector 135. It will be apparent that the level of the signal applied to input terminal 108 will be dependent upon the remanence or residual magnetic flux density of the tape T, and hence will be determined by the type of magnetic coating on the tape. Further, it will be apparent that the transistors 120, 121 and 122, which are originally in their OFF states, will be selectively turned ON in response to the level of the signal applied to input terminal 108 and that, in response to the selective turning ON of transistors 120, 121 and 122, three different patterns of output signals will be provided at output terminals 132, 133 and 134 of switching control circuit 136.

More specifically, if the tape T being sensed has a magnetic coating which provides a relatively low remanence or residual magnetism so that the signal appearing at input terminal 108 when switches 105 and 110 are open has a relatively low level sufficient to turn ON only transistor 120, then only flip-flop circuit 126 is triggered to its second state and flip-flop circuits 127 and 128 remain in their first state, as shown on FIG. 3. As a result of the foregoing, flip-flop circuit 126 provides the signal 1 at its output terminal $y$ so that input terminals $u$, $v$ and $w$ of NAND-circuit 129 all receive signals at the level 1 to provide the signal 0 at the respective output terminal 132. At the same time, input terminals $u$, $v$ and $w$ of NAND-circuit 130 will receive signals at the levels 1, 0 and 1, respectively, so that a signal at the level 1 will appear at the respective output terminal 133, while input terminals $u$, $v$ and $w$ of NAND-circuit 131 will receive signals 1, 0 and 0, respectively, so that the signal at the respective output terminal 134 will also remain at the level 1. Such signals at the levels 0, 1 and 1 appearing at the output terminals 132, 133 and 134, respectively, of switching control circuit 136 will be effective to cause switching circuits 6 and 7 to select the equalizing function and biasing signal suitable for the recording of audio or informational signals on the tape which exhibited the respective relatively low remanence or residual magnetic flux. If the remanence or residual magnetic flux sensed by element 107 results in a signal at input terminal 108 having a level sufficient to turn ON transistor 121 in addition to transistor 120, then both flip-flops 126 and 127 are triggered to their second states, while flip-flop circuit 128 remains in its first state. As a result of the foregoing, the signals appearing at output terminals 132, 133 and 134 have the values 1, 0 and 1, respectively, and circuits 6 and 7 are suitably controlled by such signals to again provide an equalizing function and biasing signal suitable for recording of the audio or informational signals on the tape having the type of magnetic coating with a remanence or residual magnetic flux sufficient to provide the signal at terminal 108 for turning ON both transistors 120 and 121. Finally, if the magnetic tape which is being sensed has a magnetic coating with a remanence or residual magnetic flux sufficient to provide a signal at input terminal 108 of a relatively high level which turns ON all of the transistors 120, 121 and 122, the resulting triggering of the three flip-flop circuit 126, 127 and 128 results in signals at the output terminals 132, 133 and 134 having the values 1, 1 and 0, respectively. Once again, these output signals at the terminals 132, 133 and 134 are effective to control switching circuits 6 and 7 to provide an equalizing function and biasing signal which are proper for recording on the respective tape.

It will be apparent that, with the tape sensing devices according to this invention, as described above, the type of magnetic coating on the tape can be sensed or detected while the tape is at rest and, if desired, the sensing of the type of magnetic coating on the tape can be made effective to automatically establish the required equalizing function and biasing level for recording on such tape. Thus, even if the kind or type of magnetic coating on a magnetic tape is not known, the conditions for proper recording on such tape can be automatically and conveniently established without requiring the transport or movement of the tape or of the handling thereof. It will further be seen that, in a tape recording and/or reproducing apparatus having a tape sensing device according to this invention, improper or defective recording of the tape can be avoided, as contrasted with conventional apparatus in which the equalizing function and biasing signal have to be manually selected by manipulation of a tape selector switch, in which latter case the failure to manipulate the switch or the selection of an improper switch position can result in an equalizing function and biasing signal that are not adapted or correct for the tape installed in the apparatus.

It will be apparent that, if desired, suitable lamps or other indicators may be connected with the switching control circuit 12 or 136 so as to be selectively illuminated for indicating the type of magnetic tape which is the subject of a sensing operation.

In the embodiments of this invention which have been described above with reference to the drawings, provision has been made for discriminating between magnetic tapes having three different types of magnetic coatings thereon and for correspondingly establishing the preferred equalizing functions and biasing signals for such tapes. However, it will be obvious that tape sensing devices according to this invention may be provided for discriminating between more than three different types of magnetic tapes.

The bias oscillating circuit 4 and the associated switching circuit 7 may be effective to change the level of the biasing signal and/or the frequency of such signal. Further, although particular circuits have been shown on FIG. 3 as being suitable for the level detector 135 and switching control circuit 136, it will be apparent that various other circuits can be provided to perform the respective functions of these circuits in response to variations in the level of the output signal from the magnetic sensitive element 107. Finally, such magnetic sensitive element 107 may be a Hall-effect element, as previously mentioned, a planar Hall element (PHE), a magneto-resistive element or the like.

Although specific embodiments of this invention and various modifications thereof have been described above with reference to the drawings, it is to be understood that the invention is not limited to those precise embodiments or modifications, and that additional changes and modifications may be effected therein by one skilled in the art without departing from the scope or spirit of the invention as defined in the appended claims.

What is claimed is:

1. A device for sensing the type of magnetic coating on a magnetic tape, comprising a DC magnetic recording head adapted to engage the magnetic tape, means for applying a predetermined DC voltage to said head so that the latter applies a DC magnetic flux to the tape while said tape is at rest, means for discontinuing the application of said DC magnetic flux, means for sensing the remanence of the magnetic tape while the latter remains at rest following the discontinuance of said DC magnetic flux to the tape, the level detecting means for detecting the level of the sensed remanence of the tape as an indication of the type of magnetic coating thereon.

2. A device according to claim 1; further comprising an oscillator providing an oscillating output which is applied to said DC magnetic recording head along with said predetermined DC voltage for an initial portion of the period during which said DC voltage is applied to the head.

3. A device for sensing the type of magnetic coating on a magnetic tape, comprising a DC magnetic recording head adapted to engage the magnetic tape, means for applying a predetermined DC voltage to said head so that the latter applies a DC magnetic flux to the tape while said tape is at rest, means for sensing the remanence of the magnetic tape while the latter remains at rest following the application of said DC magnetic flux to the tape, said means for sensing the remanence of the magnetic tape including a magnetoelectric transducer coupled with said DC magnetic recording head, and level detecting means for detecting the level of the sensed remanence of the tape as an indication of the type of magnetic coating thereon.

4. A device according to claim 3; in which said magnetoelectric transducer is a Hall-effect element.

5. A device according to claim 3; in which said DC magnetic recording head includes a core with a head gap therein and a winding on said core to which said DC voltage is applied for producing said DC magnetic flux across said gap, and said means for sensing the remanence of the magnetic tape is interposed in said core.

6. A device according to claim 5; in which the distance across said gap is less than 3 microns so that the sensed remanence of the tape will be independent of the thickness of the magnetic coating on the tape.

7. A magnetic tape recording and/or reproducing apparatus: comprising a signal recording circuit for recording informational signals on a magnetic tape; a frequency equalizing circuit connected with said signal recording circuit and having a variable equalizing function for adapting the signal recording circuit to use with magnetic tapes having different types of magnetic coatings thereon; a device for sensing the type of magnetic coating on a magnetic tape installed in the apparatus including a DC magnetic recording head adapted to engage the magnetic tape, means for applying a predetermined DC voltage to said head so that the latter applies a DC magnetic flux to the tape while said tape is at rest, means for discontinuing the application of said DC magnetic flux to said tape, means for sensing the remanence of the magnetic tape while the latter remains at rest following the discontinuance of said DC magnetic flux to the tape, and level detecting means for detecting the level of the sensed remanence of the tape as an indication of the type of magnetic coating thereon; and means responsive to the detected level of the sensed remanence for controlling said variable equalizing function of the frequency equalizing circuit in accordance with the type of magnetic coating on the tape installed in the apparatus.

8. A magnetic tape recording and/or reproducing apparatus according to claim 7; in which said signal recording circuit includes an information signal recording head engageable with the tape for said recording of the informational signals on the tape during the movement of the latter, and a bias oscillator connected with said information signal recording head for applying an AC bias to the latter; and in which said means responsive to the detected level of the sensed remanence also correspondingly controls the level of said AC bias.

9. A magnetic tape recording and/or reproducing apparatus according to claim 7; further comprising an oscillator providing an oscillating output which is applied to said DC magnetic recording head along with said predetermined DC voltage for an initial portion of the period during which said DC voltage is applied to the DC magnetic recording head so as to magnetically discharge said DC magnetic recording head.

10. A magnetic tape recording and/or reproducing apparatus according to claim 7; in which said signal recording circuit includes an information signal recording head engageable with the tape at a location along the tape spaced from said DC magnetic recording head for recording the informational signals on the tape during the movement of the latter in the direction from said DC magnetic recording head toward said information signal recording head; and further comprising a magnetic erasing head engageable with the tape between said DC magnetic recording head and said information signal recording head and being operative to erase the residual DC magnetic flux from the tape prior to the recording of informational signals on the tape.

11. A magnetic recording and/or reproducing apparatus according to claim 10; further comprising an oscillator for operating said erasing head, and means for applying the output of said oscillator to said DC magnetic recording head along with said DC voltage for an initial portion of the period during which said DC voltage is applied to said DC magnetic recording head.

12. A magnetic tape recording and/or reproducing apparatus comprising a signal recording circuit for recording informational signals on a magnetic tape; a frequency equalizing circuit connected with said signal recording circuit and having a variable equalizing function for adapting the signal recording circuit to use with magnetic tapes having different types of magnetic coatings thereon; a device for sensing the type of magnetic coating on a magnetic tape installed in the apparatus including a DC magnetic recording head adapted to engage the magnetic tape, means for applying a predetermined DC voltage to said head so that the latter applies a DC magnetic flux to the tape while said tape is at rest, means for sensing the remanence of the magnetic tape while the latter remains at rest following the application of said DC magnetic flux to the tape, said means for sensing the remanence of the magnetic tape including a magnetoelectric transducer coupled with said magnetic recording head, and level detecting means for detecting the level of the sensed remanence of the tape as an indication of the type of magnetic coating thereon; and means responsive to the detected level of the sensed remanence for controlling said variable equalizing function of the frequency equalizing circuit in accordance with the type of magnetic coating on the tape installed in the apparatus.

13. A magnetic recording and/or reproducing apparatus according to claim 12; in which said DC magnetic recording head includes a core with a head gap therein and a winding on said core to which said DC voltage is applied for producing said DC magnetic flux across said gap, and said means for sensing the remanence of the magnetic tape is interposed in said core.

14. A magnetic recording and/or reproducing apparatus according to claim 13; in which the distance across said gap is less than 3 microns so that the sensed remanence of the tape will be independent of the thickness of the magnetic coating on the tape.

15. A magnetic recording and/or reproducing apparatus according to claim 12; in which said magnetoelectric transducer is a Hall-effect element.

16. A method of sensing the type of magnetic coating on a magnetic tape comprising the steps of: applying a predetermined DC magnetic flux to said tape while said tape is stationary; discontinuing the application of said DC magnetic flux; sensing the level of remanence of said magnetic tape following the discontinuance of the application of said DC magnetic flux thereto while said magnetic tape remains stationary; and detecting the level of said sensed remanence, whereby said detected level is representative of the type of magnetic coating.

* * * * *